United States Patent [19]
Fujii et al.

[11] Patent Number: 5,851,863
[45] Date of Patent: Dec. 22, 1998

[54] SEMICONDUCTOR DEVICE

[75] Inventors: Taizo Fujii; Takehiro Hirai; Sugao Fujinaga, all of Osaka, Japan

[73] Assignee: Matsushita Electric Industrial Co., Ltd., Osaka, Japan

[21] Appl. No.: 629,248

[22] Filed: Apr. 8, 1996

[30] Foreign Application Priority Data

Apr. 7, 1995 [JP] Japan ................................. 7-082243

[51] Int. Cl.$^6$ .............................................. H01L 21/8238
[52] U.S. Cl. .......................................... 438/203; 438/234
[58] Field of Search ................................. 438/203, 205, 438/207, 302, 202, 234

[56] References Cited

U.S. PATENT DOCUMENTS 4,480,375  11/1984  Cottrell et al. .

FOREIGN PATENT DOCUMENTS 3-165522  7/1991  Japan .

Primary Examiner—Tuan H. Nguyen
Attorney, Agent, or Firm—McDermott, Will & Emery

[57] ABSTRACT

An n-type buried layer and an n-type epitaxial layer that becomes a collector layer of a pnp transistor are formed on a semiconductor substrate. A well and the collector layer are formed. Ions of an n-type impurity are implanted through a photoresist mask, to form an intrinsic base layer of the pnp transistor and a PT-VT diffusion layer with punchthrough stopper and threshold control functions of a pMOSFET. Ions of a p-type impurity are implanted through a photoresist mask at a shallow implantation depth than the previous step, to form an intrinsic base layer of an npn transistor and a channel dope layer of the pMOSFET. A buried channel is formed under the gate of the pMOSFET. Therefore pMOSFETs with good characteristics can be obtained. In this way, the present invention achieves bipolar transistors and MOSFETs with good characteristics, without having to increase the number of fabrication steps and the number of photoresist masks.

12 Claims, 10 Drawing Sheets

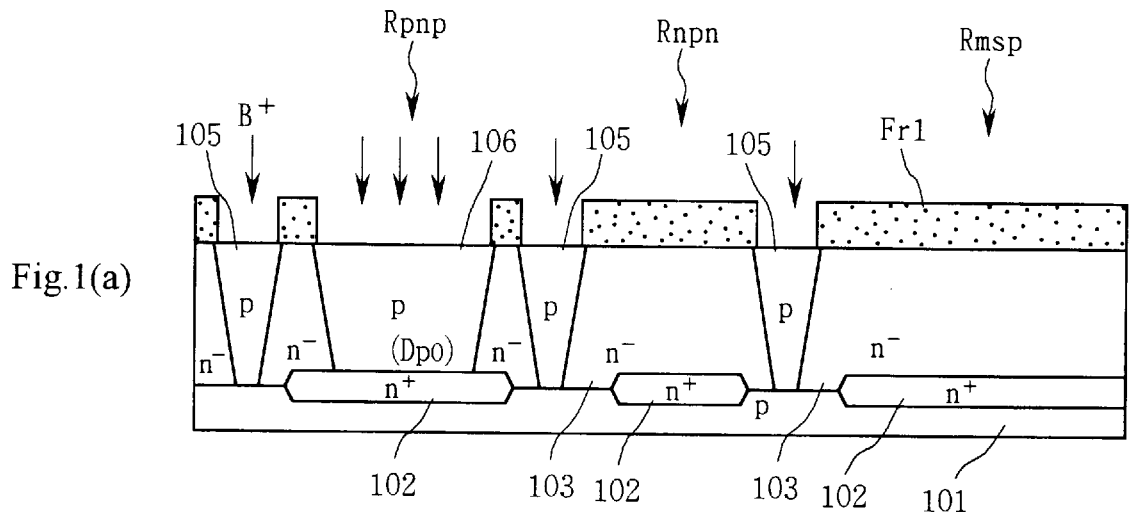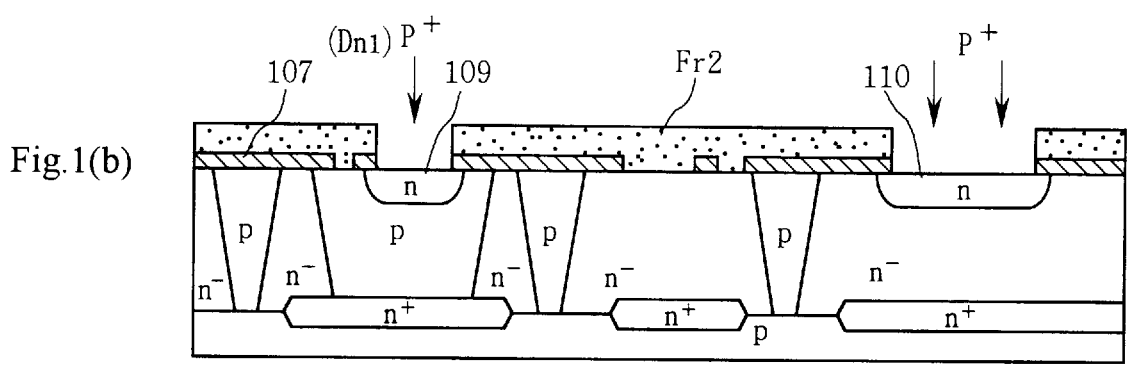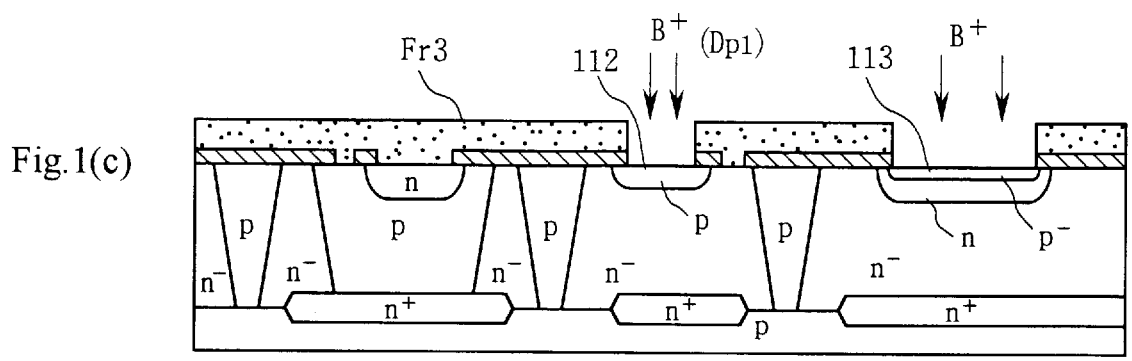

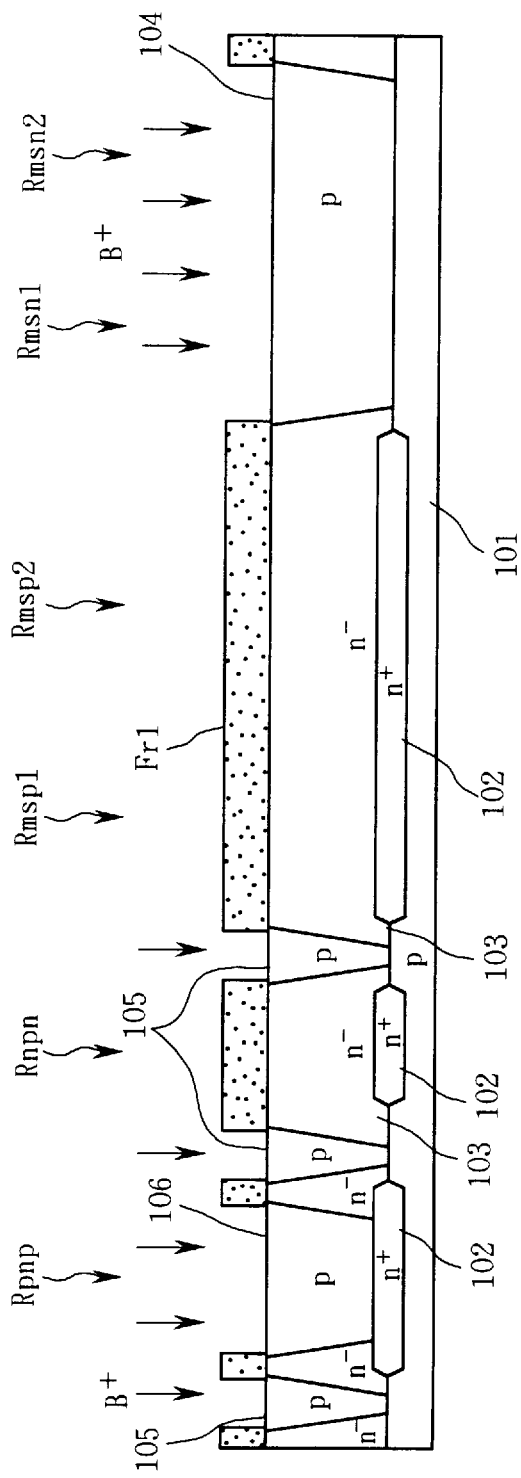
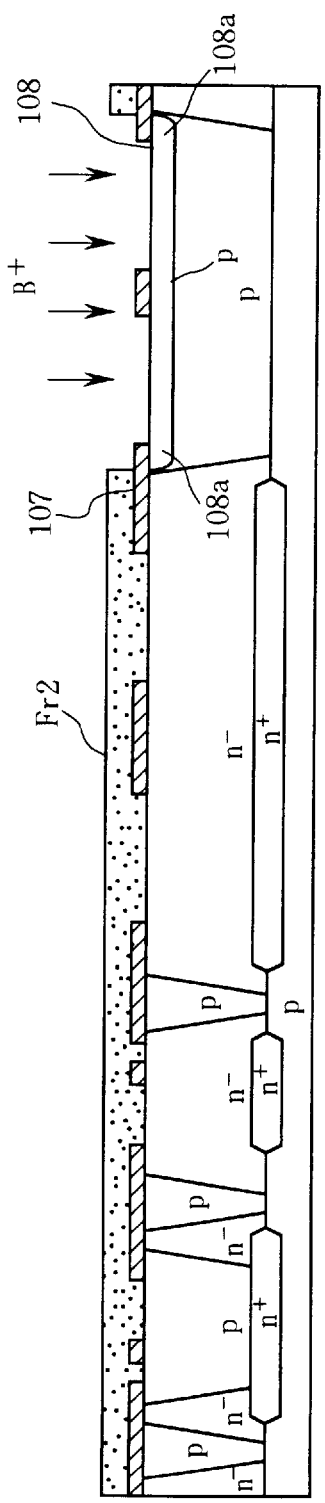
Fig.6(a)
Fig.6(b)

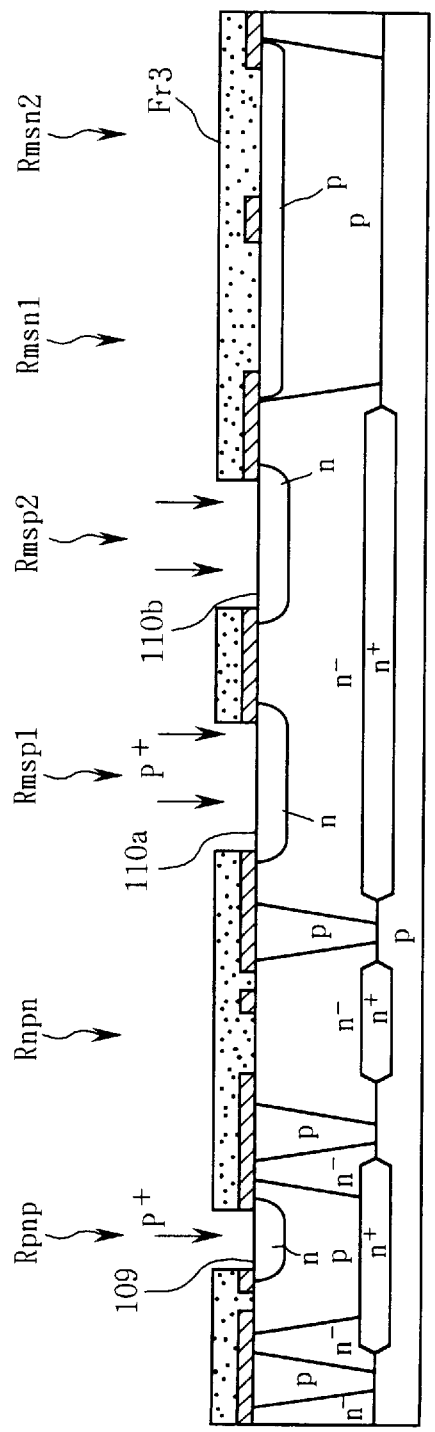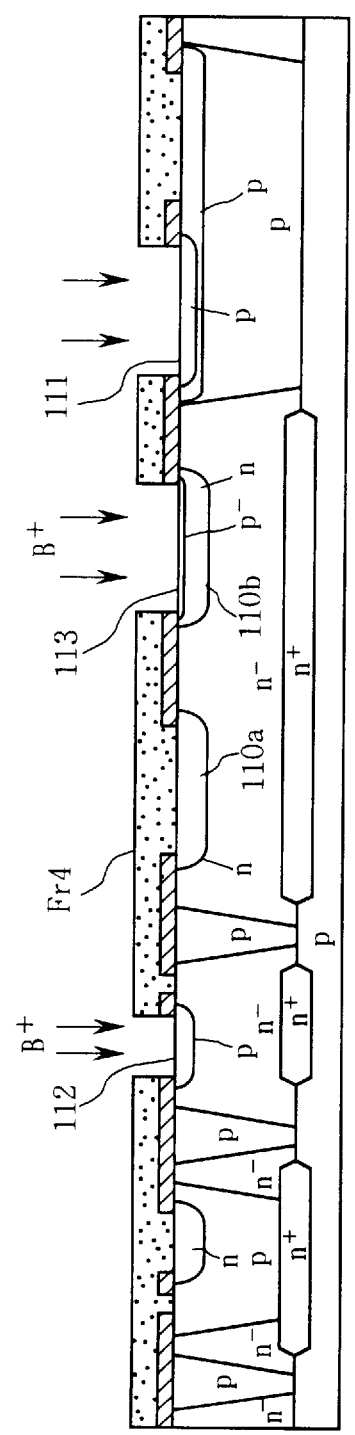
Fig.7(a)
Fig.7(b)

SEMICONDUCTOR DEVICE

BACKGROUND OF THE INVENTION

This invention relates to a semiconductor device in which bipolar transistors and metal-oxide-semiconductor field-effect transistors (MOSFETs) are formed on a semiconductor substrate and to a method for the fabrication thereof.

BiCMOS, utilizing the advantages of both bipolar transistors and MOSFETs, has been known as one of the attractive technologies for highly functional LSIs. The bipolar transistor, on the one hand, has a high accuracy analog processing capability, large current driving capability, and high speed operation capability. On the other hand, CMOS-FET has high density and low power capabilities.

A conventional process of fabricating a BiCMOS semiconductor device, shown in NIKKEI ELECTRONICS (3 Aug., 1981, pp.156–191), is described with reference to FIGS. 9(a)–9(f) of the drawings. Here an npn transistor (region Rnpn) and a pMOSFET (region Rmsp) are formed as a bipolar transistor and as a MOSFET, respectively.

As illustrated in FIG. 9(a), a first photoresist mask Fr1 is formed on a p-type semiconductor substrate 301. An n-type impurity is diffused through the first photoresist mask Fr1 into the semiconductor substrate 301. A well diffusion layer 303 for isolation between elements and a collector diffusion layer 304 of an npn transistor are formed.

As illustrated in FIG. 9(b), a thermal oxide film 305 is formed by, for example, selective oxidation.

Next as depicted in FIG. 9(c), ions of a p-type impurity are implanted through a second photoresist mask Fr2 having predetermined openings, to form a channel dope diffusion layer 307 for controlling the pMOSFET threshold voltage.

As shown in FIG. 9(d), ions of a p-type impurity are implanted through a third photoresist mask Fr3 having predetermined openings, to form an intrinsic base diffusion layer 309 of the npn transistor.

Next, as illustrated in FIG. 9(e), a gate oxide film 310 and polycrystalline silicon gate 311 of the pMOSFET are formed.

Ions of an n-type impurity are implanted through a fourth photoresist mask Fr4, to form an emitter diffusion layer 313 of the npn transistor.

Next, as illustrated in FIG. 9(f), ions of a p-type impurity are implanted through a fifth photoresist mask Fr5, to form source-drain diffusion layers 315 of the pMOSFET.

When all the diffusion layers are formed, and when each terminal is provided with a metallic electrode, the fabrication is completed.

In the above-described BiCMOS fabrication process, however, the FIG. 9(c) step of forming the layer 309 of the npn transistor and the FIG. 9(b) step of forming the layer 307 of the pMOSFET require separate photoresist masks (i.e., the second and third masks Fr2 and Fr3), although in both the steps impurities of the same type (n-type) are implanted, and two consecutive ion implantations are needed. In view of this, these two processes may be carried out simultaneously. However it is necessary to increase the impurity concentration and depth of the intrinsic base diffusion layer 309 of the npn transistor up to some degree for collector-emitter punchthrough prevention. Since the channel dope diffusion layer 307 of the pMOSFET is the layer for the formation of a buried channel of the pMOSFET, this does not allow the layer 307 to be doped as heavily as or to be formed as deep as the layer 309. Simultaneous formation of the layers 307 and 309 with a single photoresist mask is therefore difficult.

Meanwhile, for the case of pMOSFETs, source-drain punchthrough becomes serious as transistors become finer and finer. In order to eliminate such a problem without affecting npn transistor characteristics, a high impurity concentration must be achieved under the channel of a MOSFET. A punchthrough stopper diffusion layer, diffused with the same type of impurity as the well diffusion layer 303 (backgate), must be formed underneath the channel in an extra step. This may result in further increasing the number of fabrication steps.

The conventional process has the problem that the number of fabrication steps increases, which therefore increases the costs of production.

As the size of transistors decreases, the distance between MOSFETs likewise decreases. This is likely to cause a parasitic MOSFET produced between a MOSFET and another MOSFET to electrically conduct. In other words, a parasitic MOSFET in which the thermal oxide film 305 as an isolator functions as a gate insulating layer, is generated and an unexpected electric current flows. This problem may be solved by forming a channel stopper layer outside an active region of the MOSFET corresponding to a channel region of the parasitic MOSFET. This, however, results in increasing not only the number of fabrication steps but also the costs of production.

SUMMARY OF THE INVENTION

Bearing in mind the above-noted problems with the prior art techniques, the present invention was made. It is therefore an object of the present invention to provide a layer structure capable of achieving highly functional transistors and a method for accomplishing such a layer structure with a smaller number of fabrication steps.

The present invention provides a semiconductor device wherein at least a first bipolar transistor having a vertical bipolar transistor structure, at least a second bipolar transistor having a vertical bipolar transistor structure, and at least a MOSFET are formed on a semiconductor substrate, (a) the first bipolar transistor including:
 a collector layer formed by implanting an impurity of a first conductivity type into the semiconductor substrate;
 an intrinsic base layer formed by implanting an impurity of a second conductivity type into a region surrounded by the collector layer;
 an emitter layer formed by implanting an impurity of a first conductivity type into a region surrounded by the intrinsic base layer;

(b) the second bipolar transistor including:
 a collector layer formed by implanting an impurity of a second conductivity type into the semiconductor substrate;
 an intrinsic base layer formed by implanting an impurity of a first conductivity type into a region which is surrounded by the collector layer and which is shallower than the intrinsic base layer of the first bipolar transistor;
 an emitter layer formed by implanting an impurity of a second conductivity type into a region surrounded by the intrinsic base layer;

(c) the MOSFET including:
 a gate insulating film formed on the semiconductor substrate;
 a gate electrode formed on the gate insulating film;
 source-drain layers formed in regions of the semiconductor substrate on both sides of the gate electrode in which an impurity of a first conductivity type is implanted;

a first semiconductor layer of a first conductivity type formed in a surface region of the semiconductor substrate between the source-drain layers;

a second semiconductor layer of a second conductivity type formed in a region of the semiconductor substrate under the source-drain regions and the first semiconductor layer;

wherein a region in which an impurity of a first conductivity type is implanted and a region in which an impurity of a second conductivity type is implanted are overlapped in the first and second semiconductor layers wherein the first conductivity type impurity is implanted at the same depth and concentration as the intrinsic base layer of the second bipolar transistor and the second conductivity type impurity is implanted at the same depth and concentration as the intrinsic base layer of the first bipolar transistor.

It is preferred that in the first and second semiconductor layers of the MOSFET:

(i) the concentration peak point of the first conductivity type impurity is shallower than the concentration peak point of the second conductivity type impurity;

(ii) the concentration of the first conductivity type impurity is higher at surface regions of the semiconductor substrate than the concentration of the second conductivity type impurity; and (iii) the concentration of the first conductivity type impurity continuously decreases while the concentration of the second conductivity type impurity continuously increases, as depth increases.

As a result of such arrangement, a region where the concentration of the first conductivity type impurity becomes approximately equal to that of the second conductivity type impurity, acts as a channel at the time the MOSFET operates. Additionally, a deeper region with a higher concentration of the second conductivity type impurity acts as a punchthrough stopper. This achieves a low voltage operation type MOSFET with a buried channel having a low threshold voltage. Therefore, even when the density of semiconductor device increases, the power dissipation and the amount of heat generated can be held low. The characteristics of the individual bipolar transistors are unaffected. In addition to these advantages, the punchthrough stopper layer and buried channel of the MOSFET can be formed by making utilization of the step of forming the intrinsic base layers of the first and second bipolar transistors. This cuts down the number of fabrication steps and the number of photoresist masks and therefore the cost of production is reduced.

It is preferred that, at the boundary between the first and second semiconductor layers of the MOSFET, the concentration of the first conductivity type impurity and the concentration of the second conductivity type impurity are approximately equal at a depth of 50 nm to 300 nm from the surface of the semiconductor substrate.

It is preferred that the concentration of the second conductivity type impurity in the intrinsic base layer of the first bipolar transistor and the concentration of the first conductivity type impurity in the intrinsic base layer of the second bipolar transistor each fall in the range of $1\times10^{17}$ to $1\times10^{19}$/cm$^3$.

It is possible that a MOSFET of the same conductivity type as the MOSFET having a higher threshold voltage than the MOSFET is formed on the semiconductor substrate, wherein the same-conductivity-type high-threshold MOSFET includes:

a gate insulating film formed on the semiconductor substrate;

a gate electrode formed on the gate insulating film;

source-drain layers formed by implanting an impurity of a first conductivity type into regions of the semiconductor substrate on both sides of the gate electrode; and a third semiconductor layer of a second conductivity type formed by implanting, into a region of the semiconductor substrate under the gate electrode and the source-drain regions, an impurity of a second conductivity type at the same depth and concentration as the first and second semiconductor layers of the MOSFET.

As a result of such arrangement, two different types of MOSFETs having different threshold voltages are formed, which makes it possible to select a MOSFET structure according to the circuit characteristic. Additionally, it is possible to form two different types of MOSFETs having different threshold voltages by making use of the step of forming the intrinsic base layers of the bipolar transistors. The production cost can be reduced to a greater extent.

It is possible that a MOSFET of the opposite conductivity type to the MOSFET having a high threshold voltage and a MOSFET of the opposite conductivity type to the MOSFET having a low threshold voltage are formed on the semiconductor substrate, wherein the opposite-conductivity-type low-threshold MOSFET includes:

a gate insulating film formed on the semiconductor substrate;

a gate electrode formed on the gate insulating film;

source-drain layers formed by implanting an impurity of a second conductivity type into regions of the semiconductor substrate on both sides of the gate electrode; and a fourth semiconductor layer of a first conductivity type formed in a region of the semiconductor substrate under the gate electrode and the source-drain regions wherein the fourth semiconductor layer is doped with an impurity of a first conductivity type;

wherein the opposite-conductivity-type high-threshold MOSFET includes:

a gate insulating film formed on the semiconductor substrate;

a gate electrode formed on the gate insulating film;

source-drain layers formed by implanting an impurity of a second conductivity type into regions of the semiconductor substrate on both sides of the gate electrode; and a fifth semiconductor layer of a first conductivity type formed in a region of the semiconductor substrate under the gate electrode and the source-drain regions wherein the fifth semiconductor layer is doped with an impurity of a first conductivity type at the same depth and concentration as the intrinsic base layer of the second bipolar transistor and is also doped with an impurity of a first conductivity type at the same depth and concentration as the fourth semiconductor layer of the opposite-conductivity-type low-threshold MOSFET.

As a result of such arrangement, nMOSFETs having different threshold voltages and pMOSFETs are formed. Therefore, BiCMOS semiconductor devices with a high utility value can be obtained.

In each of the above-described arrangements, it is possible to include (A) an isolator of an insulating layer formed on the semiconductor substrate in such a manner as to surround each MOSFET and (B) a channel stopper layer formed in a region of the substrate under the isolator.

Such arrangement suppresses the generation of a parasitic MOSFET, whereupon highly reliable, low power semiconductor devices can be obtained.

It is preferred that the first conductivity type is p-type while the second conductivity type is n-type.

As a result of such arrangement, the first bipolar transistor becomes a pnp transistor, the second bipolar transistor becomes an npn transistor, and the MOSFET becomes a pMOSFET. In such a case, the intrinsic base layer of the npn transistor is shallower than the intrinsic base layer of the pnp transistor. This makes it possible to form an npn transistor, which is required to have a greater current gain, at a rather shallow depth. Therefore, the bipolar transistor characteristic is unaffected. The pMOSFET characteristic can be improved by provision of a buried channel. The above-described effects can be obtained successfully.

The present invention provides a method of fabricating a semiconductor device in which at least a first bipolar transistor having a vertical bipolar transistor structure, at least a second bipolar transistor having a vertical bipolar transistor structure, and at least a MOSFET are formed on a semiconductor substrate;

the semiconductor device fabrication method comprising:

(a) a first step of forming a collector layer of a first conductivity type of the first bipolar transistor, a collector layer of a second conductivity type of the second bipolar transistor, and an active region of a second conductivity type of the MOSFET;

(b) a second step of implanting an impurity of a first conductivity type into a region surrounded by the collector layer of the second bipolar transistor and into the active region of the MOSFET;

(c) a third step of implanting into the region surrounded by the collector layer of the second bipolar transistor and into a region of the active region of the MOSFET that is implanted with the second conductivity type impurity, an impurity of a first conductivity type at a smaller implantation energy than an implantation energy used in the second step; and (d) a fourth step of forming a gate electrode on the region in the active region of the MOSFET that is implanted with the first conductivity type impurity and with the second conductivity type impurity.

It is preferred that the second and third steps are carried out so that in a region of the semiconductor substrate under the gate electrode of the MOSFET:

(i) the concentration peak point of the first conductivity type impurity is shallower than the concentration peak point of the second conductivity type impurity;

(ii) the concentration of the first conductivity type impurity is higher at surface regions of the semiconductor substrate than the concentration of the second conductivity type impurity; and (iii) the concentration of the first conductivity type impurity continuously decreases while the concentration of the second conductivity type impurity continuously increases, as depth increases.

With the above-described method, the intrinsic base layers of the bipolar transistors are formed in the second and third steps. A layer, which is heavily doped with an impurity of a first conductivity type, is formed in a surface region of the semiconductor substrate under the gate electrode of the MOSFET while a layer, which is heavily doped with an impurity of a second conductivity type, is formed under that first conductivity type layer. A region where the concentration of the first conductivity type impurity becomes approximately equal to the concentration of the second conductivity type impurity becomes a buried channel, and its underlying layer, which is heavily doped with an impurity of a second conductivity type, becomes a punchthrough stopper. In comparison with a conventional method which requires three steps and photoresist masks to form the same structure as above, the present invention is able to reduce the number of photoresist masks and the number of fabrication steps. Therefore, the production cost can be cut down.

It is preferred that the second and third steps are carried out so that the concentration of the first conductivity type impurity and the concentration of the second conductivity type impurity are approximately equal at a depth of 50 nm to 300 nm from the surface of the semiconductor substrate.

It is preferred that the second and third steps are carried out so that the concentration of the second conductivity type impurity in the intrinsic base layer of the first bipolar transistor and the concentration of the first conductivity type impurity in the intrinsic base layer of the second bipolar transistor each fall in the range of $1 \times 10^{17}$ to $1 \times 10^{19}/cm^3$.

It is possible that in the first step an active region of a MOSFET of the same conductivity type as the MOSFET having a higher threshold voltage than the MOSFET is formed on the semiconductor substrate, that in the second step the active regions of the MOSFETs are implanted with an impurity of a second conductivity type, and that in the third step the active region of the same-conductivity-type high-threshold MOSFET is not subjected to implantation with an impurity of a first conductivity type.

In accordance with this method, no first conductivity type region is formed in any surface region of the semiconductor substrate under the gate of the same-conductivity-type high-threshold MOSFET and no buried channel is formed either, as a result of which the threshold voltage increases. Therefore, it is possible to form two different types of MOSFETs having different threshold voltages without having to increase the number of photoresist masks and the number of fabrication steps.

It is possible that in the first step an active region of a MOSFET of the opposite conductivity type to the MOSFET having a high threshold voltage and an active region of a MOSFET of the opposite conductivity type to the MOSFET having a low threshold voltage are formed, that the method further comprises the step of implanting an impurity of a first conductivity type into the active regions of the opposite-conductivity-type MOSFETs, and that in the third step only the active region of the opposite-conductivity-type high-threshold MOSFET is implanted with an impurity of a first conductivity type.

In accordance with such arrangement, the opposite-conductivity-type high-threshold MOSFET and the opposite-conductivity-type low-threshold MOSFET have different concentrations of the first conductivity type impurity at respective regions under their gate electrodes, in other words they have different threshold voltages. Therefore it is possible to form a semiconductor device with two different types of MOSFETs having different threshold voltages by a smaller number of fabrication steps and by a smaller number of photoresist masks.

It is possible to form a channel stopper layer of the MOSFET by making use of any one of the above-described steps.

As a result of such arrangement, it becomes possible to form a semiconductor device with a structure able to prevent the occurrence of a parasitic MOSFET without having to increase the number of fabrication steps and the number of photoresist masks.

It is preferred in each of the foregoing steps that the first conductivity type is p-type while on the other hand the second conductivity type is n-type.

As a result of such arrangement, it becomes possible to form a semiconductor device with the above-described structure by a smaller number of fabrication steps and by a smaller number of photoresist masks.

The present invention provides a method of fabricating a semiconductor device in which at least a first bipolar transistor having a vertical bipolar transistor structure, at least a second bipolar transistor having a vertical bipolar transistor structure, and at least a MOSFET are formed on a semiconductor substrate;

the semiconductor device fabrication method comprising:

(a) a first step of forming a collector layer of a first conductivity type of the first bipolar transistor, a collector layer of a second conductivity type of the second bipolar transistor, and an active region of a second conductivity type of the MOSFET;

(b) a second step of forming an intrinsic base layer of the second bipolar transistor by implanting an impurity of a first conductivity type into a region surrounded by the collector layer of the second bipolar transistor;

(c) a third step of forming a gate insulating layer and a gate electrode of the MOSFET; and (d) a fourth step of forming an intrinsic base layer of the first bipolar transistor and a pocket implantation layer of the MOSFET by implanting, in two directions inclined towards the source and drain of the MOSFET respectively, an impurity of a second conductivity type into a region surrounded by the collector layer of the first bipolar transistor and into regions of the active region of the MOSFET on both sides of the gate electrode.

In this fabrication method, the tilt angle of the impurity ion implantation direction in the fourth step is controlled so that the lateral extension of the pocket implantation layer varies, as a result of which the MOSFET threshold voltage can be controlled adequately and the pocket implantation layer functions as a punchthrough stopper. Therefore, the intrinsic base layers of the bipolar transistors and the pocket implantation layer of the MOSFET with punchthrough stopper functions and threshold voltage control functions can be formed by two fabrication steps and two photoresist masks. The production cost can be cut down.

BRIEF DESCRIPTION OF THE DRAWINGS

FIGS. 1(a)–(c) are cross-sectional views showing the first-half steps of the fabrication of a semiconductor device made in accordance with a first embodiment of this invention.

FIGS. 6(a) and 6(b) are cross-sectional views showing steps of the fabrication of a semiconductor device made in accordance with a fourth embodiment of this invention.

FIGS. 7(a) and 7(b) are cross-sectional views showing steps of the fabrication of the semiconductor device of the fourth embodiment.

DETAILED DESCRIPTION OF THE INVENTION

Embodiment 1

Figure 2A:
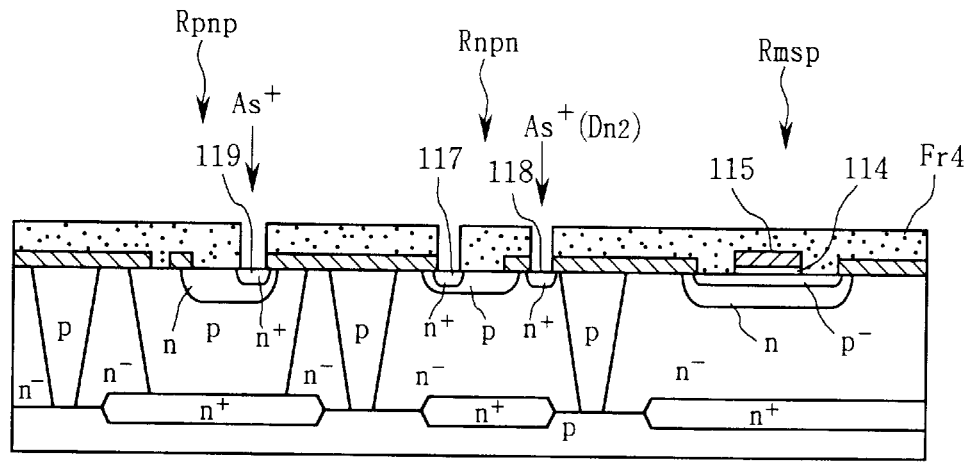
FIGS. 2(a)–2(c) are cross-sectional views showing the second-half steps of the fabrication of the semiconductor device of the first embodiment.

A semiconductor device of the first embodiment, together with a method for the fabrication thereof, is described by making reference to FIGS. 1(a)–1(c) and 2(a)–2(c).

The present embodiment is an example of this invention in which a vertical pnp transistor (region Rpnp), a vertical npn transistor (region Rnpn), and a pMOSFET (region Rmsp) are formed.

Ions of an n-type impurity, for example, arsenic ions, are implanted into selected regions of a p-type semiconductor substrate 101 having a resistivity between 10 and 20 Ω·cm, at 60 keV with an ion dose of $1\times10^{15}/cm^2$. An annealing process is carried out at, for example, 900 degrees centigrade for about 30 minutes, to form an n-type buried layer 102. Thereafter, an n-type epitaxial layer 103, the resistivity and thickness of which are 1 Ω·cm and 2.5 μm, respectively, is formed.

Ions of a p-type impurity, for example, boron ions (B$^+$), are implanted through a first photoresist mask Fr1 having predetermined openings, at 150 keV with an ion dose of $2\times10^{12}/cm^2$, to form a well diffusion layer 105 for isolation between elements and a collector diffusion layer 106 of the pnp transistor.

Next, as shown in FIG. 1(b), a thermal oxide film 107, which becomes an isolator, is formed by selective oxidation on the semiconductor substrate, having a thickness of about 350 nm. Subsequently, to obtain the same concentration distribution as shown in FIG. 10(b), an ion implantation with ions of an n-type impurity, for example, phosphorous ions (P$^+$), is carried out through a second photoresist mask Fr2 having predetermined openings, at 120 keV with an ion dose of $1.5\times10^{13}/cm^2$, to form an intrinsic base diffusion layer 109 of the pnp transistor and a PT-VT diffusion layer 110 that functions as a punchthrough stopper and as a threshold voltage control section of the pMOSFET.

Figure 10A:
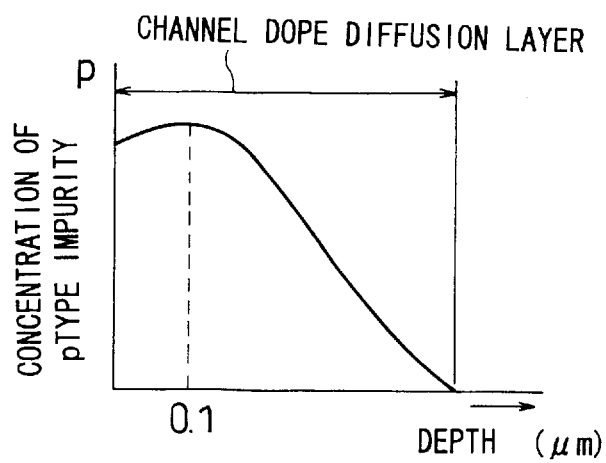
FIGS. 10(a)–10(c) are graphs showing the concentration distribution of p-impurity implanted into a region under a gate electrode in a pMOSFET formation region, the concentration distribution of n-impurity implanted into a region under a gate electrode in a pMOSFET formation region, and the resulting effective impurity concentration distribution obtained by combining the FIG. 10(a) distribution and the FIG. 10(b) distribution, respectively.
Figure 10B:
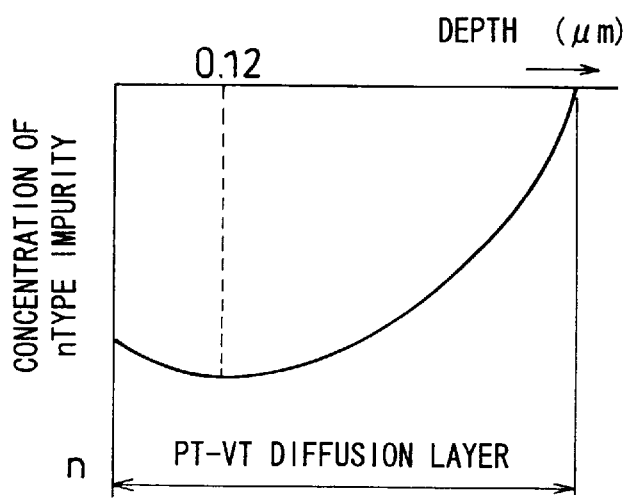

As shown in FIG. 1(c), to obtain the same concentration distribution as shown in FIG. 10(a), ions of a p-type impurity, for example, boron ions (B$^+$), are implanted through a third photoresist mask Fr3 having predetermined openings, at 30 keV with an ion dose of $1.5\times10^3/cm^2$, to form a base diffusion layer 112 of the npn transistor and a channel dope diffusion layer 113 of the pMOSFET.

As shown in FIG. 2(a), the surface of the semiconductor substrate is covered with an about 15-nm thick gate oxide film 114 and thereafter an n-type polycrystalline silicon gate 115 is formed. Subsequently, ions of an n-type impurity, for example, arsenic ions (As$^+$), are implanted through a fourth photoresist mask Fr4, at 40 keV with an ion dose of $1 \times 10^{16}/cm^2$, to form an emitter diffusion layer 117 and collector contact diffusion layer 118 of the npn transistor and a base contact diffusion layer 119 of the pnp transistor.

Figure 2B:
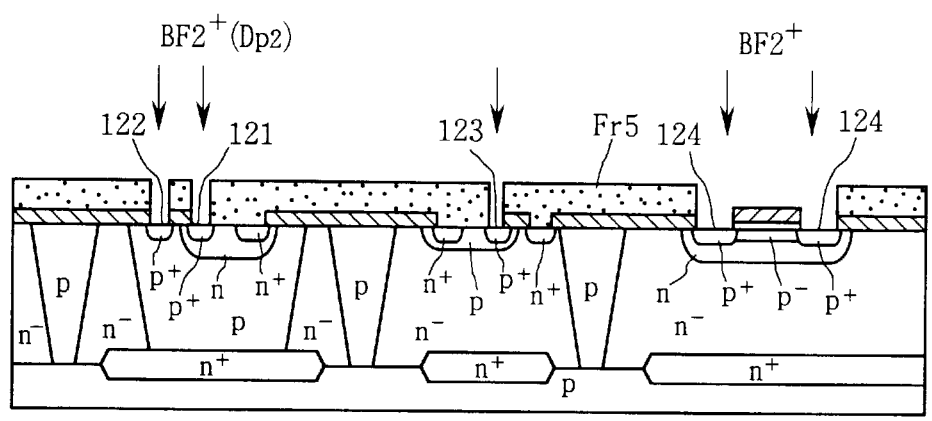

Next, as shown in FIG. 2(b), ions of a p-type impurity, for example, boron fluoride ions (BF$^{2+}$), are implanted, at 40 keV with an ion dose of $3 \times 10^{15}/cm^2$, to form an emitter diffusion layer 121 and collector contact diffusion layer 122 of the pnp transistor, a base contact diffusion layer 123 of the npn transistor, and source-drain diffusion layers 124 of the pMOSFET.

Figure 2C:
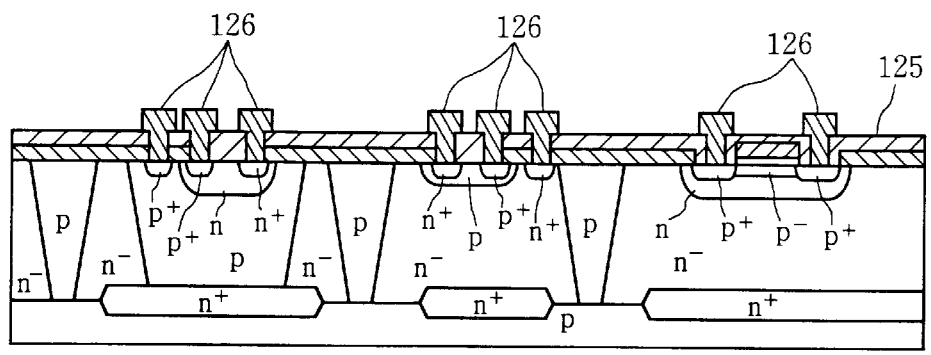

Finally, as shown in FIG. 2(c), a protective film 125 is formed on the entire surface of the semiconductor substrate. A metallic electrode 126 is formed and the formation of the individual transistors is completed.

It is preferred that impurities are implanted at an ion dose of about $1 \times 10^{17}/cm^2$ to about $1 \times 10^{19}/cm^2$ in the steps shown in FIGURES 1(b) and 1(c).

The concentration of impurity in each of the layers of the transistors formed in the above-described steps are now discussed here. If:

(a) the concentration of impurity (p-type) in the collector diffusion layer 106 of the pnp transistor=Dp0;

(b) the initial concentration of impurity (n-type) in the n-type epitaxial layer 103=Dn0;

(c) the concentration of impurity (n-type, phosphorous) implanted in the FIG. 1(b) step=Dn1;

(d) the concentration of impurity (p-type, boron) implanted in the FIG. 1(c) step=Dp1;

(e) the concentration of impurity (n-type, arsenic) implanted in the FIG. 2(a) step=Dn2; and (f) the concentration of impurity (p-type, boron fluoride) implanted in the FIG. 2(b) step=Dp2;

then the individual layers will have the following effective impurity concentrations, respectively.

1. pnp TRANSISTOR
   Emitter Diffusion Layer 121: Dp2+Dp0−Dn1
   Intrinsic Base Diffusion Layer 109: Dn1−Dp0
   Base Contact Diffusion Layer 119: Dn2+Dn1−Dp0
   Collector Diffusion Layer 106: Dp0
   Collector Contact Diffusion Layer 122: Dp2+Dp0
2. npn TRANSISTOR
   Emitter Diffusion Layer 117: Dn2+Dn0−Dp1
   Intrinsic Base Diffusion Layer 112: Dp1−Dn0
   Base Contact Diffusion Layer 123: Dp2+Dp1−Dn0
   Collector Diffusion Layer (103): Dn0
   Collector Contact Diffusion Layer 118: Dn2+Dn0
3. pMOSFET
   Channel Dope Diffusion Layer 113: Dp1−Dn1−Dn0
   PT-VT diffusion layer 110: Dn1+Dn0−Dp1
   Source-drain Diffusion Layer 124: Dp2+Dp1−Dn1−Dn0

The ion implantation energy used in FIG. 1(b) step is much smaller than the one used in FIG. 1(a) and therefore the depth of the intrinsic base diffusion layer 112 of the npn transistor becomes shallower than the depth of the intrinsic base diffusion layer 109 of the pnp transistor. Additionally, in a region extending between the PT-VT diffusion layer 110 and the channel dope diffusion layer 113, the layers 109 and 110 are different from each other in the peak point of the concentration of impurity, although they are doped to the same concentration level. In other words, the peak point of the concentration of the n-type impurity (phosphorous) implanted into the layer 109 is deeper than the peak point of the concentration of the p-type impurity (boron) implanted into the channel dope diffusion layer 113 (see FIGS. 10(a) and (b)).

Figure 10C:
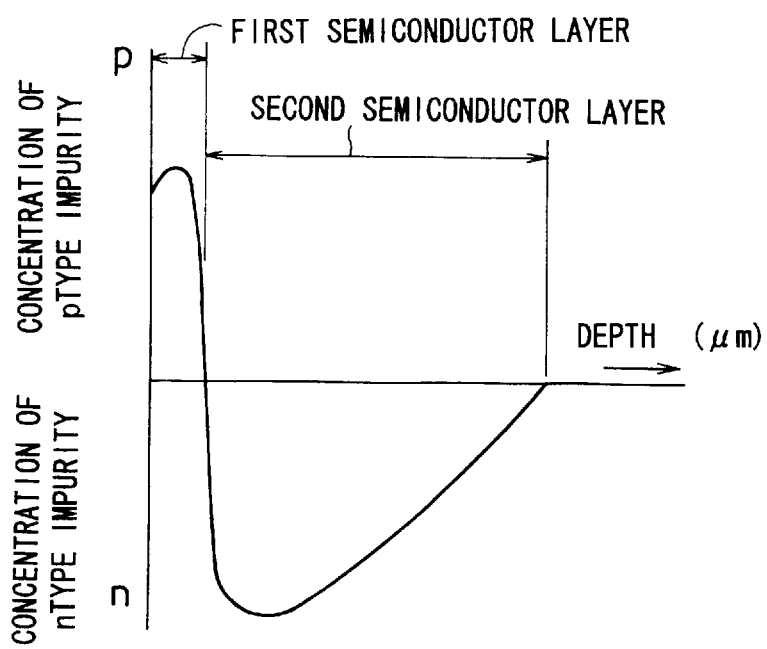

As shown in FIG. 10(c), the effective concentration of the p-impurity is high in the vicinity of the surface of the semiconductor substrate, but it becomes low after the peak point and finally becomes negative. On the other hand, the effective concentration of the n-impurity varies conversely to the p-impurity concentration. That is, a heavily boron-doped portion is formed in a region near the substrate surface. The concentration of boron decreases while the concentration of phosphorous increases. More specifically, after a thin p-type region, which is a first semiconductor layer, is formed in the vicinity of the substrate surface, an n-type region, which is a second semiconductor layer, is formed under that p-type region. The concentration of p-impurity and the concentration of n-impurity agree midway between the p-doped region and the n-doped region. A region around where the p- and n-impurity concentrations are equal functions as a channel when the pMOSFET operates. In other words, a buried channel is formed and a pMOSFET with desirable characteristics is obtained.

In order to maintain the threshold voltage of the pMOSFET within the adequate range, preferably the concentration of the p-type impurity and the concentration of the n-type impurity agree at a depth between 50 nm and 300 nm.

Additionally, the depth of the intrinsic base diffusion layer 112 of the npn transistor can be reduced, which makes it possible to obtain a high current gain. The depth of the intrinsic base diffusion layer 109 of the pnp transistor is somewhat deep; however, it the concentration of the p-type impurity in the collector layer 106 is controlled, this makes it possible to provide pnp transistors with good characteristics. Therefore, the bipolar transistor characteristic is not influenced.

Figure 9A:
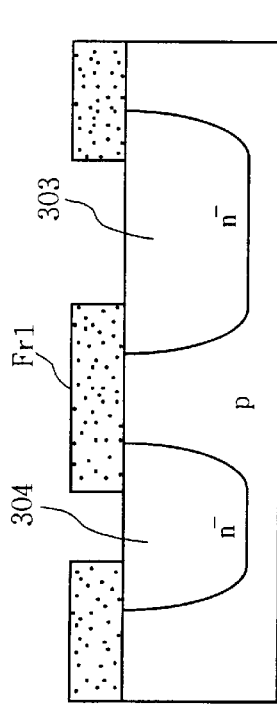
FIGS. 9(a) through 9(f) are a cross-sectional view showing a step of the fabrication of a conventional BiCMOS semiconductor device.
Figure 9B:
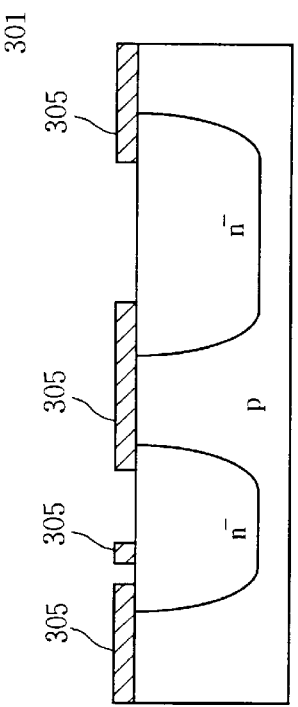
Figure 9C:
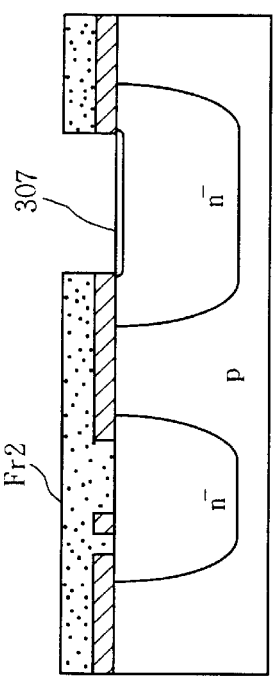
Figure 9D:
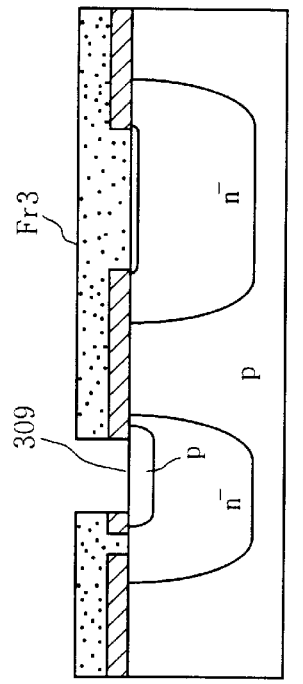
Figure 9E:
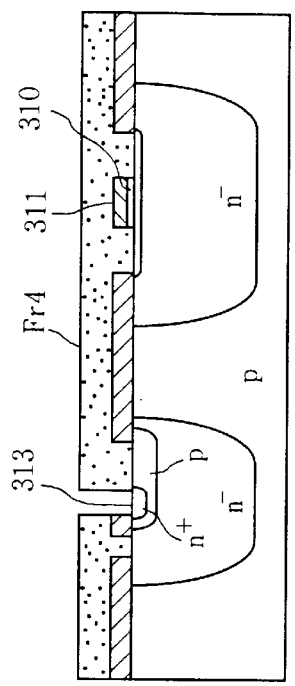
Figure 9F:
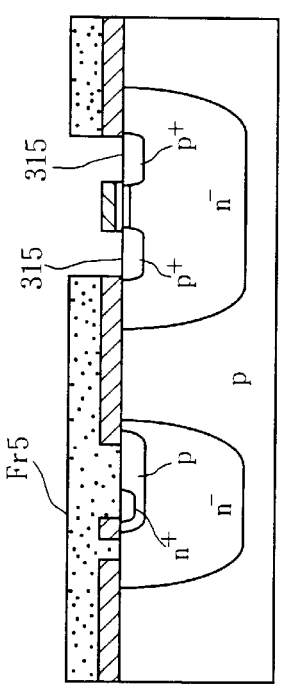

In accordance with the present embodiment, in the FIG. 1(b) step, the base diffusion layer 109 of the pnp transistor and the PT-VT diffusion layer 110 of the pMOSFET are formed using the same photoresist mask, i.e, the photoresist mask Fr2. Further, in the FIG. 1(c) step, the intrinsic base diffusion layer 112 of the npn transistor and the channel dope diffusion layer 113 of the pMOSFET are formed using the same photoresist mask (i.e, the photoresist mask Fr3). In the fabrication of a conventional BiCMOS semiconductor device as shown in FIGS. 9(a)–(f) (the step of forming a pnp transistor is not shown), the formation of a base diffusion layer of the pnp transistor requires one more step in addition to the steps as shown in FIGS. 9(c) and (d). At least three photoresist masks are required and at least three steps are needed.

Conversely, in accordance with the present embodiment, only two steps of FIGS. 1(b) and (c) employing only two photoresist masks (i.e., the second and third photoresist masks Fr2 and Fr3) are required to form the intrinsic base diffusion layer 109 of the pnp transistor, the intrinsic base diffusion layer 112 of the npn transistor, and the channel dope diffusion layer 113 and PT-VT diffusion layer 110 of the pMOSFET. The number of pMOSFET steps can be reduced thereby reducing the costs of production.

In the present embodiment, thermal oxidation is used for oxide film formation. CVD technology may be used instead. Instead of an ion implantation process, a thermal diffusion process may be employed to form collector and base contact layers of a bipolar transistor. Contact diffusion layers are not always necessary.

Embodiment 2

Figure 3:
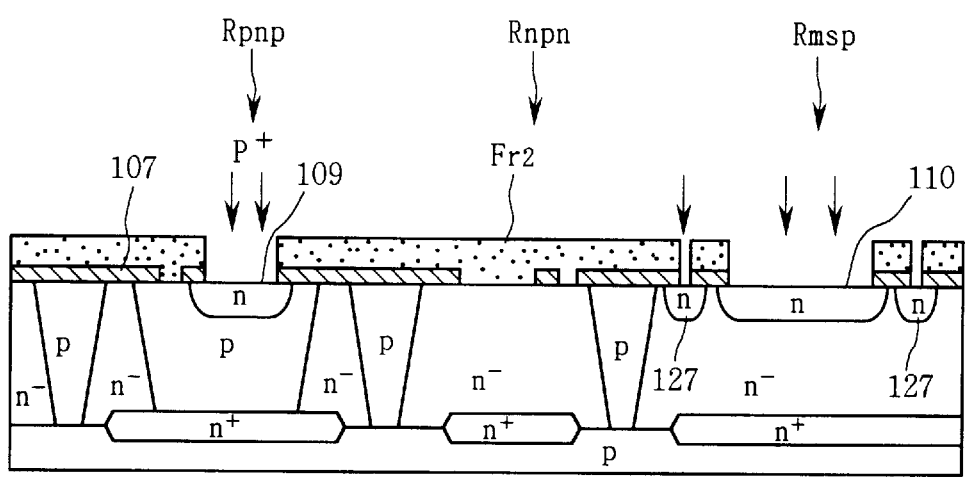
FIG. 3 is a cross sectional view showing a step of the fabrication of a semiconductor device made in accordance with a second embodiment of this invention.

Referring to FIG. 3, a transistor based on the second embodiment is now explained. FIG. 3 shows in cross section one step in the present embodiment. This FIG. 3 step is equivalent to the FIG. 1(b) step of the first embodiment.

A step, which is the same as the FIG. 1(a) step, is first carried out in the present embodiment. Subsequently, the FIG. 3 step is carried out. More specifically, the thermal oxide film 107, which becomes an isolator, is formed with a thickness of about 350 nm on the semiconductor substrate by means of selective oxidation. The second photoresist mask Fr2 having predetermined openings is formed. At this time, corresponding openings are also formed in portions of the thermal oxide film 107 on both sides of the region Rmsp where the pMOSFET is formed. Ions of an n-type impurity, for example, phosphorous ions ($P^+$), are implanted through the second photoresist mask Fr2, at 120 keV with an ion dose of $1.5 \times 10^{13}/cm^2$, to form the base diffusion layer 109 of the pnp transistor, the PT-VT diffusion layer 110 of the pMOSFET, and the channel stopper diffusion layer 127.

Thereafter, steps identical with the ones as shown in FIGS. 1(c) and 2(a)–(c) are carried out.

In accordance with the present embodiment, a BiCMOS semiconductor device is formed by carrying out the same number of fabrication steps as the first embodiment, and the channel stopper diffusion layers 127 can be formed by diffusion with n-type impurities into isolating regions on both sides of the pMOSFET through the photoresist mask Fr2 which is slightly different in pattern from the one used in the first embodiment.

In addition to the advantage that the same effect as the first embodiment can be obtained, the generation of a parasitic MOSFET in which the thermal oxide films 107 on either side of the pMOSFET act as gate oxide films can be prevented, without having to increase the number of fabrication steps.

Although in the present embodiment the channel stopper diffusion layer 127 is formed outside the active region of the pMOSFET, they may be integrally formed by an arrangement such that impurities extend to outside the active region by diffusion.

Embodiment 3

Referring to FIGS. 4(a)–(c) and 5(a)–(c), the third embodiment is explained now.

Figure 4A:
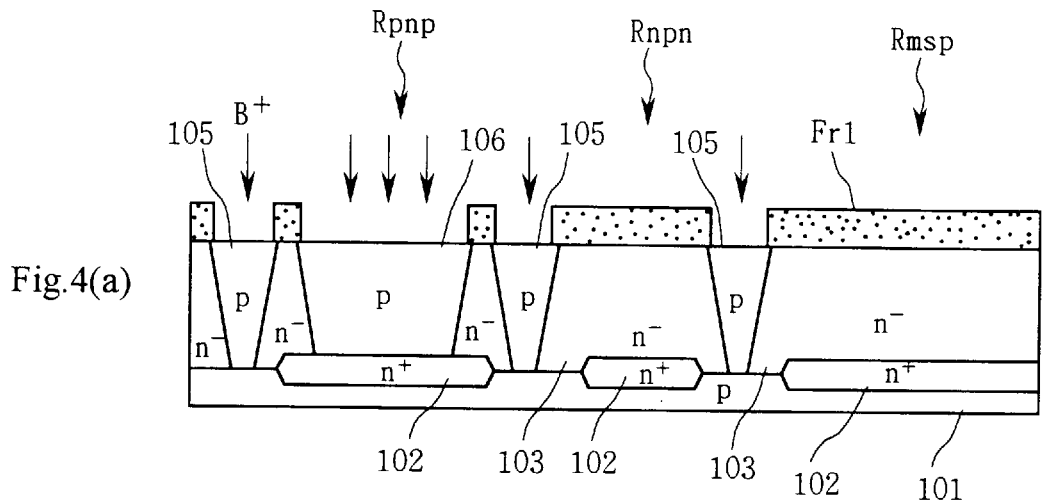
FIGS. 4(a)–4(c) are cross-sectional views showing the first-half steps of the fabrication of a semiconductor device made in accordance with a third embodiment of this invention.

The FIG. 4(a) step, which is the same processing as the FIG. 1(a) step, is carried out.

The thermal oxide film 107, which becomes an isolator, is formed with a thickness of about 350 nm on the semiconductor substrate by means of selective oxidation. Ions of a p-type impurity, for example, boron ions ($B^+$), are implanted through the second photoresist mask Fr2, at 30 keV with an ion dose of $1.5 \times 10^{13}/cm^2$, to form the base diffusion layer 112 of the npn transistor.

Figure 4B:
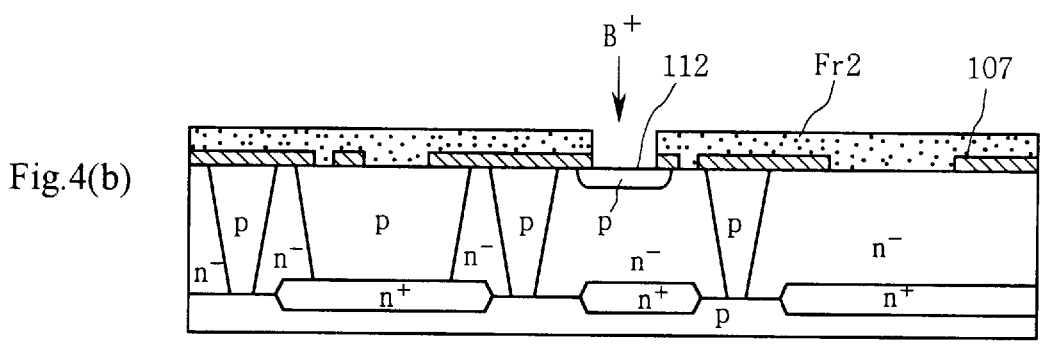
Figure 4C:
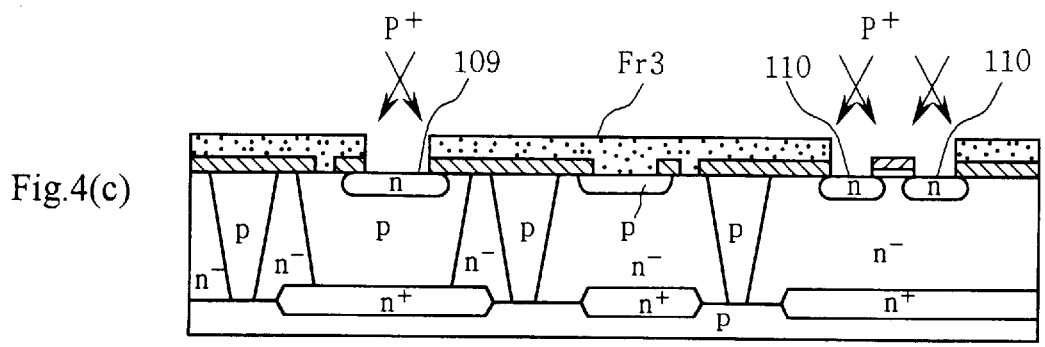

Next, as shown in FIG. 4(c), the surface of the semiconductor substrate is covered with the gate oxide film 114 having a thickness of about 15 nm. Subsequently, the n-type polycrystalline silicon gate 115 is formed. Ions of an n-type impurity, for example, phosphorous ions ($P^+$), are implanted through the third photoresist mask Fr3 by means of a 4-step large tilt angle ion implantation process (tilt angle: 25 degrees), at 150 keV with an ion dose of $3 \times 10^{12}/cm^2$. Under such conditions, the total dose will be about $1.2 \times 10^{13}/cm^2$. In this step, both the base diffusion layer 109 of the pnp transistor and the PT-VT diffusion layer 110 of the pMOSFET are formed.

Where a 4-step implantation is carried out, adequate implantation parameters are as follows. For the case of phosphorus ($P^+$), the implantation energy is 100–180 keV, preferably 120–150 keV, and the dose per implantation is from $1 \times 10^{12}$ to $5 \times 10^{12}/cm^2$ (total: $4 \times 10^{12}$ to $2 \times 10^{13}/cm^2$), and the tilt angle of the ion implantation direction is from 10 to 45 degrees, preferably 15 to 30 degrees.

Figure 5A:
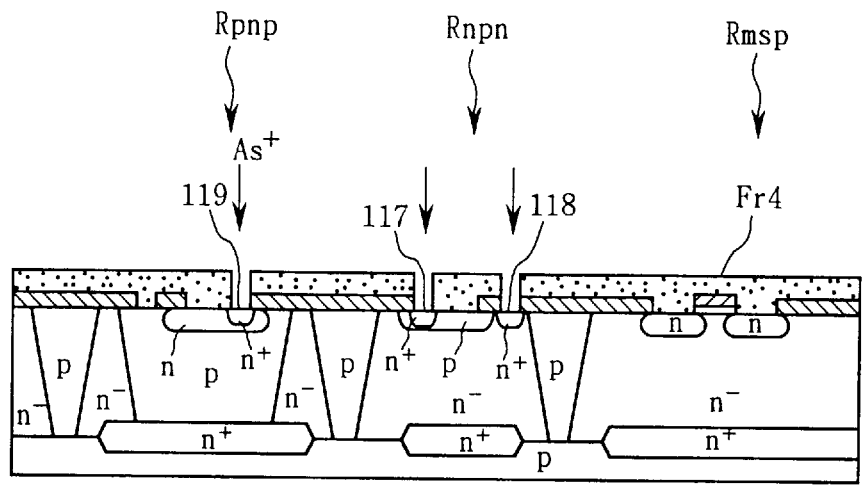
FIGS. 5(a)–5(c) are cross-sectional views showing the second-half steps of the fabrication of the semiconductor device of the third embodiment.
Figure 5B:
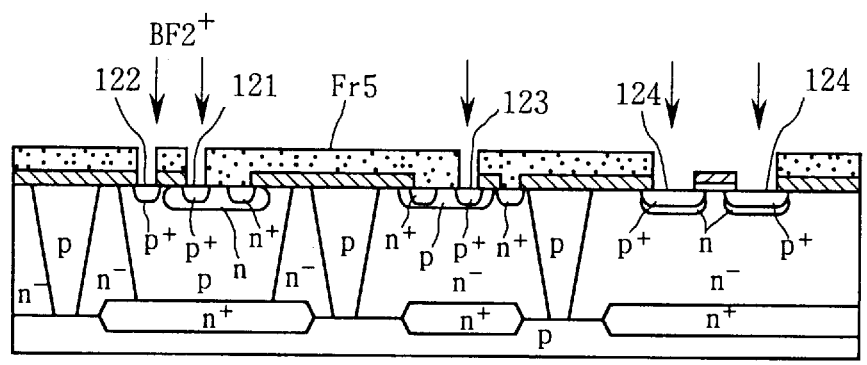
Figure 5C:
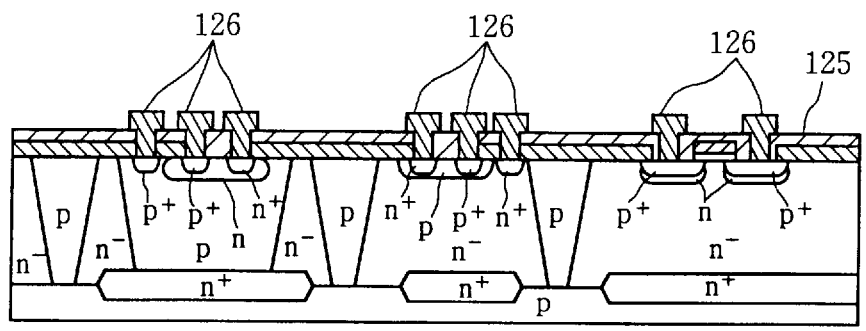

Steps as shown in FIGS. 5(a)–(c), which are identical with the ones as shown in FIGS. 1(a)–(c), are carried out. These steps are not described here.

In the present embodiment, if:
- (a) the concentration of impurity (p-type) in the collector diffusion layer 106 of the pnp transistor is Dp0;
- (b) the concentration of impurity in the n-type epitaxial layer 103 is Dn0;
- (c) the concentration of impurity (p-type, boron) implanted in the FIG. 4(b) step is Dp1;
- (d) the concentration of impurity (n-type, phosphorus) implanted in the FIG. 4(c) step is Dn1;
- (e) the concentration of impurity (n-type, arsenic) implanted in the FIG. 5(a) step is Dn2; and
- (f) the concentration of impurity (p-type, boron fluoride) implanted in the FIG. 2(b) step is Dp2;

then the individual layers will have the following effective impurity concentrations, respectively.

1. pnp TRANSISTOR
   Emitter Diffusion Layer 121: Dp2+Dp0−Dn1
   Intrinsic Base Diffusion Layer 109: Dn1−Dp0
   Base Contact Diffusion Layer 119: Dn2+Dn1−Dp0
   Collector Diffusion Layer 106: Dp0
   Collector Contact Diffusion Layer 122: Dp2+Dp0
2. npn TRANSISTOR
   Emitter Diffusion Layer 117: Dn2+Dn0−Dp1
   Intrinsic Base Diffusion Layer 112: Dp1−Dn0
   Base Contact Diffusion Layer 123: Dp2+Dp1−Dn0
   Collector Diffusion Layer (103): Dn0
   Collector Contact Diffusion Layer 118: Dn2+Dn0
3. pMOSFET
   Source-drain Diffusion Layer 124: Dp2−Dn1−Dn0
   PT-VT Diffusion layer 110: Dn1+Dn0
   Well Diffusion Layer 103: Dn0
   (Channel Region)

In the FIG. 4(c) step, the base diffusion layer 109 of the pnp transistor and the PT-VT diffusion layer 110 of the pMOSFET are formed by impurity ion implantation through the same photoresist mask, as in the first embodiment. However, in the present embodiment, such ion implantation is carried by means of a 4-step large tilt angle ion implantation. Unlike the first embodiment, no channel dope diffusion layers for buried channel formation are formed in the present embodiment. The present embodiment finds applications in the fabrication of surface channel type pMOSFETs. The degree of entry of the PT-VT diffusion layer 110 into a directly-under-gate region can be controlled by the tilt angle of an impurity ion implantation direction in the FIG. 4(c) step, and the threshold voltage can be controlled adequately by the structure of the PT-VT diffusion layer 110. The present embodiment is identical with the first embodiment in the number of fabrication steps performed and in the number of photoresist masks used. Therefore, the present embodiment is able to provide the same effect as the first embodiment.

In the present embodiment, a 4-step large tilt angle ion implantation is employed in forming a pocket implantation layer. Instead of using a 4-step tilt angle ion implantation, two or more ion implantations of different implantation directions may be carried out. Additionally, a rotational implantation technique, in which a semiconductor substrate is rotated continuously with an ion implantation source fixed, may be used.

Embodiment 4

Referring now to FIGS. 6(a) and (b), 7(a) and (b), and 8(a)–(c), the fourth embodiment is described below.

The description will be made in terms of a BiCMOS including a vertical pnp transistor (region Rpnp), a vertical npn transistor (region Rnpn), a first pMOSFET (region Rmsp1), a second pMOSFET (region Rmsp2), a first nMOSFET (region Rmsn1), and a second nMOSFET (region Rmsn2).

As shown in FIG. 6(a), ions of an n-type impurity, for example, arsenic ions, are implanted into selected portions of the p-type semiconductor substrate 101 with, for example, a resistivity between 10 and 20 Ω·cm, at 60 kev with an ion dose of $1\times10^{15}/cm^2$. Subsequently, an annealing process is carried out at a temperature of, for example, 900 degrees centigrade for about 30 minutes, to form the n-type buried layer 102. Thereafter, the n-type epitaxial layer 103, the resistivity and thickness of which are 1 Ω·cm and about 2.5 μm, respectively, is formed. This step is basically the same as the FIG. 1 step of the first embodiment.

Ions of a p-type impurity, for example, boron ions ($B^+$), are implanted through the first photoresist mask Fr1 at 150 kev with an ion dose of $2\times10^{12}/cm^2$, to form the well diffusion layer 104 which becomes a backgate of each nMOSFET, the well diffusion layer 105 for element isolation, and the collector diffusion layer 106 of the pnp transistor.

Next, as shown in FIG. 6(b), the thermal oxide film 107, which becomes an isolator, is formed with a thickness of about 350 nm on the semiconductor substrate by means of selective oxidation. Boron ions ($B^+$) are implanted through the second photoresist mask Fr2 having predetermined openings, at 130 keV with an ion dose of $3.8\times10^{12}/cm^2$, to form the PT-VT diffusion layers 108 of the first and second nMOSFETs. This PT-VT diffusion layer 108 not only acts as a punchthrough stopper but also has a function of controlling the threshold voltage. At this time, boron ions ($B^+$) pierce the thermal oxide film 107 of the opening region of the photoresist mask Fr2 down to the inside of the semiconductor substrate. Therefore, the PT-VT diffusion layer 108 extends to under the thermal oxide film 107 and this region 108a acts as a channel stopper layer.

As shown in FIG. 7(a), ions of an n-type impurity, for example, phosphorous ions ($P^+$), are implanted through the third photoresist mask Fr3 having predetermined openings, at 120 keV with an ion dose of $1.5\times10^{13}/cm^2$, to form the base diffusion layer 109 of the pnp transistor, the PT-VT diffusion layers 110a and 110b of the first and second pMOSFETs. These PT-VT diffusion layers 110a and 110b are extended by diffusion to near the edge of the isolating region and these regions act as channel stoppers.

However, impurity ions may be implanted through openings formed in the thermal oxide film 107 into the substrate, to form channel stopper layers of the nMOSFET and pMOSFET, Next, as shown in FIG. 7(b), ions of a p-type impurity, for example, boron ions ($B^+$), are implanted through the fourth photoresist mask Fr4 at 30 keV with an ion dose of $1.5\times10^{13}/cm^2$, to form the base diffusion layer 112 of the npn transistor, the channel dope diffusion layer 113 of the second pMOSFET, and the second channel dope diffusion layer 111 of the first nMOSFET. At this time, neither the region Rmsp1 where the first pMOSFET is formed nor the region Rmsn2 where the second nMOSFET is formed is subjected to ion implantation.

Figure 8A:
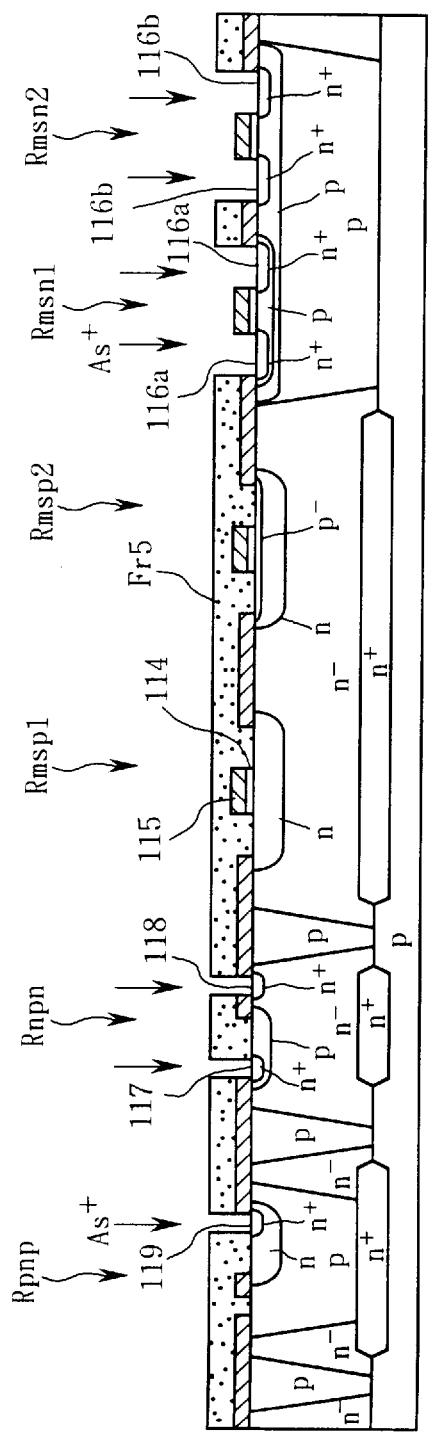
FIGS. 8(a) through 8(b) are cross-sectional views showing steps of the fabrication of the semiconductor device of the fourth embodiment.

As shown in FIG. 8(a), the surface of the semiconductor substrate is covered with the gate oxide film 114 having a thickness of about 15 nm and thereafter the n-type polycrystalline silicon gate 115 is formed. Subsequently, ions of an n-type impurity, for example, arsenic ions ($As^+$), are implanted through the fourth photoresist mask Fr4 at 40 keV with an ion dose of $1\times10^{16}/cm^2$, to form the emitter diffusion layer 117 and collector contact diffusion layer 118 of the npn transistor, the base contact diffusion layer 119 of the pnp transistor, and the source-drain diffusion layers 116a and 116b of the first and second nMOSFETs.

Figure 8B:
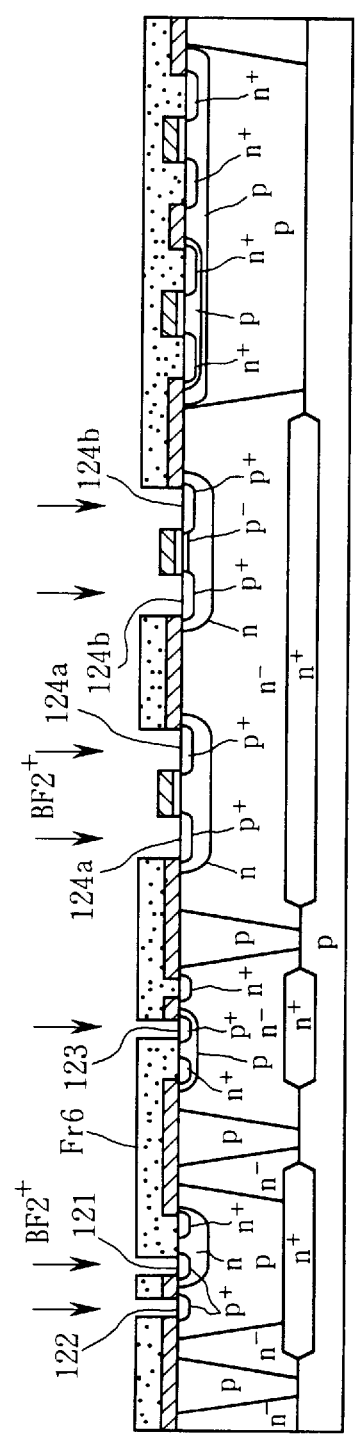

As shown in FIG. 8(b), ions of a p-type impurity, for example, boron fluoride ions ($BF^{2+}$), are implanted through the fifth photoresist mask Fr5 having predetermined openings, at 40 keV with an ion dose of $3\times10^{15}/cm^2$, to form the emitter diffusion layer 121 and collector contact diffusion layer 122 of the pnp transistor, the base contact diffusion layer 123 of the npn transistor, and the source-drain diffusion regions 124a and 124b of the first and second pMOSFETs.

Figure 8C:
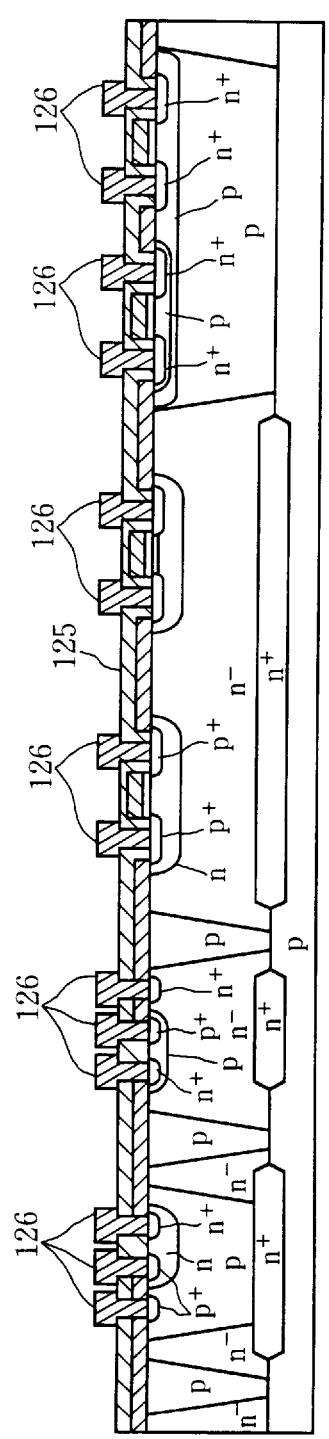

Finally, as shown in FIG. 8(c), the protective film 125 is formed on the entire surface of the semiconductor substrate, and the metallic electrode 126 is formed. Each of the transistors has now been completed.

In the present embodiment, if:
(a) the concentration of impurity (p-type) in the collector diffusion layer 106 of the pnp transistor=Dp0;
(b) the initial concentration of impurity (n-type) in the epitaxial layer 103=Dn0;
(c) the concentration of impurity (p-type, boron) implanted in the FIG. 6(b) step=Dp1';
(d) the concentration of impurity (n-type, phosphorus) implanted in the FIG. 7(a) step=Dn1;
(e) the concentration of impurity (p-type, boron) implanted in the FIG. 7(b) step=Dp1;
(f) the concentration of impurity (n-type, arsenic) implanted in the FIG. 8(a) step=Dn2; and
(g) the concentration of impurity (p-type, boron fluoride) implanted in the FIG. 8(b) step=Dp2;
then the individual layers will have the following effective impurity concentrations, respectively.

1. pnp TRANSISTOR
   Emitter Diffusion Layer 121: Dp2+Dp0−Dn1
   Intrinsic Base Diffusion Layer 109: Dn1−Dp0
   Base Contact Diffusion Layer 119: Dn2+Dn1−Dp0
   Collector Diffusion Layer 106: Dp0
   Collector Contact Diffusion Layer 122: Dp2+Dp0
2. npn TRANSISTOR
   Emitter Diffusion Layer 117: Dn2+Dn0−Dp1
   Intrinsic Base Diffusion Layer 112: Dp1−Dn0
   Base Contact Diffusion Layer 123: Dp2+Dp1−Dn0
   Collector Diffusion Layer (103): Dn0
   Collector Contact Diffusion Layer 118: Dn2+Dn0
3. First pMOSFET
   PT-VT Diffusion Layer 110a: Dn1+Dn0
   (Channel Region)
   Source-drain Diffusion Layer 124a: Dp2−Dn1−Dn0
4. Second pMOSFET
   Channel Dope Diffusion Layer 113: Dp1−Dn1−Dn0
   PT-VT diffusion layer 110b: Dn1+Dn0−Dp1
   Source-drain Diffusion Layer 124b: Dp2+Dp1−Dn1−Dn0

5. First nMOSFET
   PT-VT Diffusion Layer 108: Dp1+Dp1'+Dp0
   Source-drain Diffusion Layer 116a: Dn2−Dp1−Dp1'−Dp0
   Channel Dope Diffusion Layer 111: Dp1'+Dp0
6. Second nMOSFET
   PT-VT Diffusion Layer 108: Dp1'+Dp0
   (Channel Region)
   Source-drain Diffusion Layer 116b: Dn2−Dp1'−Dp0

The second pMOSFET of the present embodiment has the PT-VT diffusion layer 10b and the channel dope diffusion layer 113 and is a low threshold voltage MOSFET with a buried channel. On the other hand, the first pMOSFET of the present embodiment has the PT-VT diffusion layer 110a which acts as a punchthrough stopper in the semiconductor substrate and also as a channel region near the substrate surface. The first pMOSFET is therefore a high threshold voltage MOSFET.

In the first nMOSFET, the diffusion layer 111, which becomes a channel region, is formed by performing implantations with p-type impurities three times. Therefore, the first nMOSFET becomes a MOSFET having a high threshold voltage. On the other hand, in the second nMOSFET, the diffusion layer 108, which becomes a channel region, is formed by performing implantations with p-type impurities twice. Therefore, the second nMOSFET becomes a MOSFET having a low threshold voltage.

In the present embodiment, only two photoresist masks, i.e., the masks Fr3 and Fr4 (see FIGS. 7(a) and (b)), are used for forming the base diffusion layer 112 of the npn transistor, and the PT-VT diffusion layer 110b and channel dope diffusion layer 113 of the second pMOSFET. Therefore, the present embodiment is able to achieve the same effect as the first embodiment.

Further, in accordance with the present embodiment, by means of the two steps shown in FIGS. 7(a) and (b), two different types of pMOSFETs having different threshold voltages can be formed without having to increase the number of fabrication steps and the number of photoresist masks, in other words a high threshold voltage MOSFET (the first pMOSFET) and a low threshold voltage MOSFET (the second pMOSFET) are formed.

The FIG. 6(b) step may be omitted in cases where no punchthrough stopper is formed in an nMOSFET. Accordingly, it is possible to form, utilizing the FIG. 7(b) step, two different types of nMOSFETs having different threshold voltages without having to increase the number of fabrication steps and the number of photoresist masks, in other words a high threshold voltage MOSFET (the first nMOSFET) and a low threshold voltage MOSFET (the second nMOSFET) are formed.

As described above, the present embodiment is able to achieve the same effect as the first embodiment. Another advantage of the present embodiment is that it makes it possible to form two different types of pMOSFETs having different threshold voltages and two different types of nMOSFETs, in other words high threshold voltage MOSFETs (the first pMOSFET and the first nMOSFET) and low threshold voltage MOSFETs (the second pMOSFET and the second nMOSFET) can be formed by a much smaller number of steps.

Other Embodiments

Either in the first embodiment or in the second embodiment, an nMOSFET may be formed on the semiconductor substrate. In such a case, the nMOSFET may be formed on the p-type well diffusion layer 103, and a PT-VT diffusion layer of the nMOSFET may be formed in the FIG. 1(c) step.

In the FIG. 4(c) step of the third embodiment, the implantation direction of phosphorus ions ($P^+$) may be greatly inclined so that the two PT-VT diffusion layers 110 on both sides of the gate overlap under the gate.

The invention claimed is:

1. A method of fabricating a semiconductor device in which at least a first bipolar transistor having a vertical bipolar transistor structure, at least a second bipolar transistor having a vertical bipolar transistor structure, and at least a MOSFET are formed on a semiconductor substrate;

said semiconductor device fabrication method comprising:
   (a) a first step of forming a collector layer of a first conductivity type of said first bipolar transistor, a collector layer of a second conductivity type of said second bipolar transistor, and an active region of a second conductivity type of said MOSFET;
   (b) a second step of forming a base diffusion layer of a second conductivity type in a region surrounded by said collector layer of said first bipolar transistor by implanting an impurity of a second conductivity type thereinto, and forming a diffusion layer of a second conductivity type in a region surrounded by said active region of said MOSFET by implanting an impurity of a second conductivity type thereinto, said second-conductivity-type base diffusion layer and said second-conductivity-type diffusion layer are formed simultaneously with each other by one-time ion-implantation of an impurity of a second conductivity type;
   (c) a third step of forming a base diffusion layer of a first conductivity type in a region surrounded by said collector layer of said second bipolar transistor by implanting an impurity of a first conductivity type thereinto and forming a channel dope diffusion layer of a first conductivity type which includes at-least a portion where a channel is to be formed in a region that is within said second-conductivity-type diffusion layer of said MOSFET by implanting an impurity of a first conductivity type thereinto, said first-conductivity-type base diffusion layer and said first-conductivity-type channel dope diffusion layer are formed simultaneously with each other by one-time ion-implantation of an impurity of a first conductivity type at a smaller implantation energy than an implantation energy used in said second step; and
   (d) a fourth step of forming a gate electrode on said region where said second-conductivity-type diffusion layer and said first conductivity-type channel dope diffusion layer are formed in said active region of said MOSFET, said fourth step being conducted subsequently to said third step.

2. A method of fabricating a semiconductor device according to claim 1,
   wherein said second and third steps are carried out so that in a region of said semiconductor substrate under said gate electrode of said MOSFET:
   the concentration peak point of said first conductivity type impurity is shallower than the concentration peak point of said second conductivity type impurity;
   the concentration of said first conductivity type impurity is higher at surface regions of said semiconductor substrate than the concentration of said second conductivity type impurity; and
   the concentration of said first conductivity type impurity continuously decreases while the concentration of said second conductivity type impurity continuously increases, as depth increases.

3. A method of fabricating a semiconductor device according to claim 1 wherein said second and third steps are carried out so that the concentration of said first conductivity type impurity and the concentration of said second conductivity type impurity are approximately equal at a depth of 50 nm to 300 nm from the surface of said semiconductor substrate.

4. A method of fabricating a semiconductor device according to claim 1, wherein said second and third steps are carried out so that the concentration of said second conductivity type impurity in said base diffusion layer of said first bipolar transistor and the concentration of said first conductivity type impurity in said base diffusion layer of said second bipolar transistor each fall in the range of $1 \times 10^{17}$ to $1 \times 10^{19}/cm^3$.

5. A method of fabricating a semiconductor device according to claim 1 wherein in said second step an impurity of a second conductivity type is implanted into at least a portion of an isolating region of said semiconductor substrate that surrounds said active region of said MOSFET.

6. A method of fabricating a semiconductor device according to claim 1, wherein in said first step an active region of a MOSFET of the same conductivity type as said MOSFET having a higher threshold voltage than said MOSFET is formed on said semiconductor substrate;

wherein in said second step said active regions of said MOSFETs are implanted with an impurity of a second conductivity type;

wherein in said third step said active region of said same-conductivity-type high-threshold MOSFET is not subjected to implantation with an impurity of a first conductivity type.

7. A method of fabricating a semiconductor device according to claim 6 wherein in said second step an impurity of a second conductivity type is implanted into at least a portion of an isolating region of said semiconductor substrate that surrounds said active regions of said MOSFET and said same-conductivity-type high-threshold MOSFET.

8. A method of fabricating a semiconductor device according to claim 1, wherein in said first step an active region of a MOSFET that is of the opposite conductivity type to said MOSFET and has a high threshold voltage and an active region of a MOSFET that is of the opposite conductivity type to said MOSFET and has a low threshold voltage are formed;

wherein said method further comprises the step of implanting an impurity of a first conductivity type into said active regions of said opposite-conductivity-type MOSFETs; and wherein in said third step a channel dope diffusion layer which includes a portion where a channel is to be formed is formed in said opposite-conductivity-type high-threshold MOSFET by said one-time ion-implantation of an impurity of a first conductivity type.

9. A method of fabricating a semiconductor device according to claim 8, wherein in said second step an impurity of a second conductivity type is implanted into at least portions of isolating regions of said semiconductor substrate that surround said active regions of said MOSFET and said opposite-conductivity-type high-threshold MOSFET;

wherein, in said step of implanting said first conductivity type impurity into said active regions of said opposite-conductivity-type MOSFETs, an impurity of a second conductivity type is implanted into at least portions of isolating regions of said semiconductor substrate that surround said active regions of said opposite-conductivity-type MOSFETs.

10. A method of fabricating a semiconductor device according to claim 1 wherein said first conductivity type is p-type and said second conductivity type is n-type.

11. A method of fabricating a semiconductor device according to claim 1, wherein said second-conductivity-type diffusion layer in said MOSFET serves as a punchthrough stopper.

12. A method of fabricating a semiconductor device in which at least a first bipolar transistor having a vertical bipolar transistor structure, at least a second bipolar transistor having a vertical bipolar transistor structure, and at least a MOSFET are formed on a semiconductor substrate;

said semiconductor device fabrication method comprising:

(a) a first step of forming a collector layer of a first conductivity type of said first bipolar transistor, a collector layer of a second conductivity type of said second bipolar transistor, and an active region of a second conductivity type of said MOSFET;

(b) a second step of forming an intrinsic base layer of said second bipolar transistor by implanting an impurity of a first conductivity type into a region surrounded by said collector layer of said second bipolar transistor;

(c) a third step of forming a gate insulating layer and a gate electrode of said MOSFET; and (d) a fourth step of forming an intrinsic base layer of said first bipolar transistor and a pocket implantation layer of said MOSFET by implanting, in two directions inclined towards the source and drain of said MOSFET respectively, an impurity of a second conductivity type into a region surrounded by said collector layer of said first bipolar transistor and into regions of said active region of said MOSFET on both sides of said gate electrode.

* * * * *

UNITED STATES PATENT AND TRADEMARK OFFICE
CERTIFICATE OF CORRECTION

PATENT NO. : 5,851,863
DATED : December 22, 1998
INVENTOR(S) : Taizo FUJII et al.

It is certified that error appears in the above-identified patent and that said Letters Patent is hereby corrected as shown below:

<u>ON THE TITLE</u> PAGE, [54] AND COLUMN 1, LINE 1, delete "SEMICONDUCTOR DEVICE" and insert

--METHOD FOR FABRICATING A SEMICONDUCTOR DEVICE--.

Signed and Sealed this

Eighteenth Day of May, 1999

Attest:

Q. TODD DICKINSON

Attesting Officer

Acting Commissioner of Patents and Trademarks

UNITED STATES PATENT AND TRADEMARK OFFICE
CERTIFICATE OF CORRECTION

PATENT NO. : 5,851,863
DATED : December 22, 1998
INVENTOR(S) : Taizo FUJII, et al.

It is certified that error appears in the above-identified patent and that said Letters Patent is hereby corrected as shown below:

Column 1, Line 1, change "SEMICONDUCTOR DEVICE" to --METHOD FOR FABRICATING A SEMICONDUCTOR DEVICE--.

Signed and Sealed this

Eighth Day of May, 2001

*Attest:*

NICHOLAS P. GODICI

*Attesting Officer*     *Acting Director of the United States Patent and Trademark Office*